(12) United States Patent
Wang et al.

(10) Patent No.: US 11,132,875 B1
(45) Date of Patent: Sep. 28, 2021

(54) METHOD AND APPARATUS FOR PASSIVELY DETECTING CARD SKIMMERS BASED ON EMI FINGERPRINTS

(71) Applicant: Oracle International Corporation, Redwood Shores, CA (US)

(72) Inventors: Guang C. Wang, San Diego, CA (US); William A. Wimsatt, Kennebunk, ME (US); Andrew J. Lewis, Litchfield, NH (US); Michael H. S. Dayringer, Union City, CA (US); Kenny C. Gross, Escondido, CA (US)

(73) Assignee: Oracle International Corporation, Redwood City, CA (US)

( * ) Notice: Subject to any disclaimer, the term of this patent is extended or adjusted under 35 U.S.C. 154(b) by 0 days.

(21) Appl. No.: 16/891,938

(22) Filed: Jun. 3, 2020

(51) Int. Cl.
  *G07F 19/00* (2006.01)
  *G01R 31/00* (2006.01)

(52) U.S. Cl.
  CPC ....... *G07F 19/2055* (2013.01); *G01R 31/001* (2013.01); *G07F 19/207* (2013.01)

(58) Field of Classification Search
  CPC .............. G07F 19/2055; G07F 19/207; G06Q 20/1085; G06Q 20/18; G01R 31/001
  USPC .............................. 235/379, 380; 705/16, 43
  See application file for complete search history.

(56) References Cited

U.S. PATENT DOCUMENTS

| | | | |
|---|---|---|---|
| 2004/0200894 A1* | 10/2004 | Ramachandran | G07F 19/207 235/379 |
| 2010/0161525 A1* | 6/2010 | Gross | G01R 33/10 706/12 |
| 2015/0213428 A1* | 7/2015 | Hodges | H04K 3/822 705/18 |
| 2018/0191775 A1* | 7/2018 | Watson | G06N 20/00 |
| 2018/0286211 A1* | 10/2018 | Yap | G06Q 20/1085 |

* cited by examiner

*Primary Examiner* — Suezu Ellis
(74) *Attorney, Agent, or Firm* — Park, Vaughan, Fleming & Dowler LLP

(57) ABSTRACT

A system is provided that detects a card skimmer in a target system, wherein the card skimmer surreptitiously gathers credit/debit card information during operation of the target system. This system first gathers target electromagnetic interference (EMI) signals by monitoring EMI signals generated by the target system through an external scanner with a directional antenna. Next, the system generates a target EMI fingerprint from the target EMI signals. The system then compares the target EMI fingerprint against a reference EMI fingerprint for the target system to determine whether the target system contains a card skimmer.

18 Claims, 5 Drawing Sheets

METHOD AND APPARATUS FOR PASSIVELY DETECTING CARD SKIMMERS BASED ON EMI FINGERPRINTS

BACKGROUND

Field

The disclosed embodiments generally relate to techniques for detecting card skimmers, which can be surreptitiously inserted into point of sale (POS) systems and automated teller machines (ATMs), to obtain credit/debit card information. More specifically, the disclosed embodiments relate to a technique that passively detects card skimmers based on EMI fingerprints associated with electromagnetic emissions from POS systems and ATMs.

Related Art

Card skimmers, which are used by criminals to obtain credit/debit card information, have become a serious problem. Criminals can surreptitiously install card skimmers into POS systems and ATMS to capture magnetic stripe data when a credit/debit card is used. External skimmers make use of a magnetic head concealed in a false faceplate to read the magnetic stripe of a card as it is inserted into the real card reader. Internal skimmers, which are becoming more common and are more difficult to detect, are typically attached to the cable that connects the card reader to the main circuit board of a POS terminal. This enables an internal skimmer to tap into the data and draw power.

Gas pumps make ideal skimming targets because they have relatively weak security. Their internal circuitry can be typically accessed using universal physical keys, which are carried by service technicians. Moreover, internal skimmers can be easily installed in gas pumps, and require only 30 seconds to install. In fact, a well-practiced perpetrator can install an internal skimmer in just ten seconds, leaving no visual evidence of its presence. To make data harvesting easier, internal skimmers often include a Bluetooth-to-serial module that allows the perpetrator to covertly collect the "skimmed" card data from the safety of their car. This enables a perpetrator to plant many skimmers throughout a large metropolitan area, and then drive around using their cell phone to harvest credit card data with little fear of detection. Gas pump skimmers come in many shapes, sizes and colors, and can be hidden inside of a gas pump enclosure, making them difficult to detect. As a result, inspectors must manually open gas pumps in order to inspect the wiring for skimmers.

Hence, what is needed is a technique that facilitates detecting card skimmers without having to perform time-consuming manual inspection operations.

SUMMARY

The disclosed embodiments provide a system that detects a card skimmer in a target system, wherein the card skimmer surreptitiously gathers credit/debit card information during operation of the target system. This system first gathers target electromagnetic interference (EMI) signals by monitoring EMI signals generated by the target system through an external scanner with a directional antenna. Next, the system generates a target EMI fingerprint from the target EMI signals. The system then compares the target EMI fingerprint against a reference EMI fingerprint for the target system to determine whether the target system contains a card skimmer.

In some embodiments, the target system comprises one of the following: a gas pump with a credit/debit card reader; a point of sale (POS) system with a credit/debit card reader; and an automated teller machine (ATM) with a credit/debit card reader.

In some embodiments, the system performs one or more of the following remedial actions when the target system is determined to include a card skimmer: sending a notification that causes the target system to be disabled; sending a notification to a service technician to enable the service technician to remove the card skimmer from the target system; and sending a notification that causes a photograph or other information to be obtained that can possibly be used to identify a perpetrator who installed the card skimmer in the target system.

In some embodiments, generating the target EMI fingerprint from the target EMI signals involves: partitioning the target EMI signals into a set of equally spaced frequency bins; constructing a target amplitude time-series signal for each of the frequency bins by averaging the EMI signals within each frequency bin; and generating the target EMI fingerprint by combining the target amplitude time-series signals for each of the frequency bins.

In some embodiments, prior to obtaining the target EMI signals, the system generates the reference EMI fingerprint. During this process, the system gathers reference EMI signals, which are generated by a reference system of the same type as the target system, wherein the reference system is certified not to contain a card skimmer. Next, the system generates the reference EMI fingerprint from the reference EMI signals.

In some embodiments, generating the reference EMI fingerprint from the reference EMI signals involves: partitioning the reference EMI signals into a set of equally spaced frequency bins; constructing a reference amplitude time-series signal for each of the frequency bins by averaging the EMI signals within each frequency bin; and generating the reference EMI fingerprint by combining the reference amplitude time-series signals for each of the frequency bins.

In some embodiments, while comparing the target EMI fingerprint against the reference EMI fingerprint, the system creates a three-dimensional reference fingerprint surface from the time-series signals in the reference EMI fingerprint, wherein the reference fingerprint surface includes an amplitude dimension, a frequency dimension and a time dimension. The system also creates a three-dimensional target fingerprint surface from the time-series signals in the target EMI fingerprint, wherein the target fingerprint surface includes an amplitude dimension, a frequency dimension and a time dimension. Next, the system computes a mean absolute error (MAE) between the target fingerprint surface and the reference fingerprint surface. Finally, the system determines that the target system contains a card skimmer when the computed MAE exceeds a predetermined threshold value, and otherwise determines that the target system does not contain a card skimmer.

In some embodiments, comparing the target EMI fingerprint against the reference EMI fingerprint involves comparing the target EMI fingerprint against multiple reference EMI fingerprints for all possible makes/models of the target system, so that the detection operation can be used for all possible makes/models of the target system.

In some embodiments, the external scanner comprises a portable scanner with a microcontroller.

DETAILED DESCRIPTION

Figure 1:
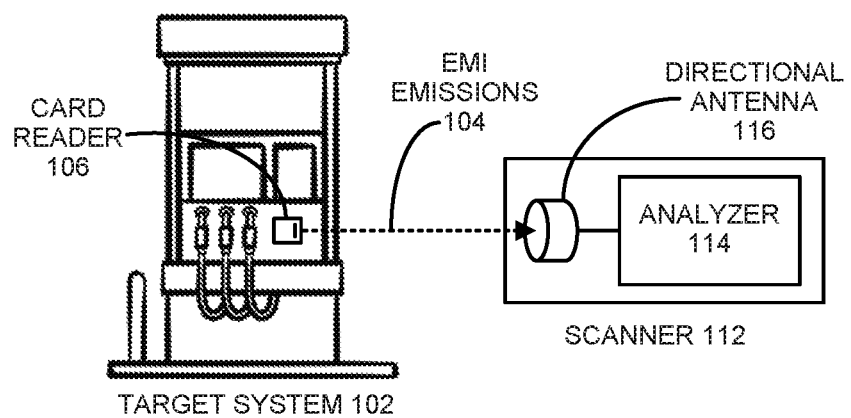
FIG. 1 illustrates an exemplary card skimmer detection system in accordance with the disclosed embodiments.

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Discussion

Existing techniques for detecting card skimmers in gas pumps require periodic visual inspection. As discussed above, this visual inspection involves manually opening gas pumps to inspect internal wiring for skimmers. This process is associated with both high labor costs and low detection efficiency.

Another technique has been recently developed to detect the Bluetooth-based skimmers by scanning nearby Bluetooth signals at gas stations and analyzing any detected Bluetooth devices based on class-of-device, MAC prefix and device name. This technique is significantly more efficient than manual inspection. However, like all smartphones and Bluetooth audio systems, the Bluetooth-based skimmer module can be placed in a "non-discoverable mode" so it does not respond to normal Bluetooth scans; this will defeat the Bluetooth-based technique. Moreover, many skimmers use a Global System for Mobile Communications (GSM) modem as an alternative to Bluetooth; this allows the credit/debit card information to be received via cellular signals that carry text messages. These cellular signals cannot be detected by a Bluetooth scanner, which means that a cellular signal scanner will be required to detect such card skimmers.

The above-described limitations of existing techniques can be overcome through an EMI fingerprint analysis technique. Although Bluetooth communications can be easily camouflaged, EMI radiation is an intrinsic property of all electronic components, including card skimming circuitry, and it cannot be eliminated or hidden. Although a number of techniques can be used to make the Bluetooth connections invisible, such as switching a Bluetooth device to undiscoverable mode or low energy mode, a Bluetooth device will continue to emit EMI radiation as long as the device is active. Similarly, although GSM-based card skimmers may emit a different frequency range than Bluetooth-based card skimmers, these GSM-based card skimmers can similarly be detected through EMI fingerprint analysis techniques. Finally, in contrast to Bluetooth detectors that need to be deployed in close proximity to the devices being scanned, an EMI fingerprint scanner with a directional antenna can detect a card skimmer installed in a gas pump or an ATM from up to 30 feet away. Note that attenuation from a gas pump's metal enclosure does not block the range at which EMI scans are effective. Laboratory experiments have demonstrated that EMI signals can be measured by an inexpensive antenna system.

The EMI fingerprint-based detector for card skimmers described in this disclosure includes a "collimated" directional antenna, which makes it possible to identify gas station card skimmers using recently developed, low-cost software defined radio (SDR) units, which can be configured in multi-antenna configurations to passively surveil islands of three, six, or 18 gas pumps to generate alerts when card skimmers have been surreptitiously installed in any of the gas pumps. Alternatively, the EMI fingerprint-based card skimmer detector can be implemented in a portable detector built around a microcontroller, such as Raspberry Pi™, which has an embedded CPU and memory powerful enough to receive the EMI signals from a directional antenna and process the signals in real time.

Before describing how the EMI fingerprint-based card skimmer detection system operates, we first describe a few details about the card skimmer detection system.

Card Skimmer Detection System

FIG. 1 illustrates an exemplary card skimmer detection system 100 in accordance with the disclosed embodiments.

As illustrated in FIG. 1, the system 100 includes a scanner 112, which monitors EMI emissions 104 from a target system 102. Target system 102 can generally include any electronic system that takes payment information from a credit card or a debit card. As mentioned above, target system 102 can include: a gas pump with a credit/debit card reader; a POS system with a credit/debit card reader; or an ATM with a credit/debit card reader. (In the exemplary embodiment illustrated in FIG. 1, target system 102 is a gas pump with a card reader 106.)

Scanner 112 can generally include any system that includes a directional antenna 116, which is configured to receive EMI emissions 104 from target system 102, and an analyzer 114, which includes computational circuitry for analyzing the received EMI emissions 104. In some embodiments, scanner 112 is a portable scanner, and analyzer 114 comprises a microcontroller, such as a Raspberry Pi™.

Process of Detecting Card Skimmers

Figure 2:
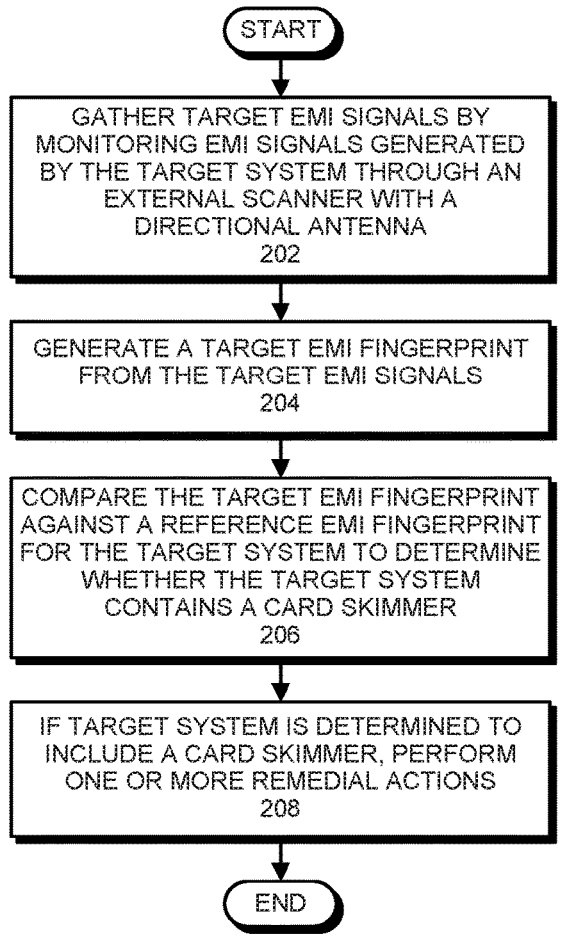
FIG. 2 presents a flow chart illustrating operations performed by a system that detects a card skimmer in a target system in accordance with the disclosed embodiments.

FIG. 2 presents a flow chart illustrating operations of a system that detects a card skimmer in a target system, wherein the card skimmer surreptitiously gathers credit/debit card information during operation of the target system. During operation, the system gathers target EMI signals by monitoring EMI signals generated by the target system through an external scanner with a directional antenna (step 202). The system then generates a target EMI fingerprint from the target EMI signals (step 204). Next, the system compares the target EMI fingerprint against a reference EMI fingerprint for the target system to determine whether the target system contains a card skimmer (step 206). Finally, if the target system is determined to include a card skimmer, the system performs one or more remedial actions (step 208). As mentioned above, the remedial actions can involve sending a notification that causes the target system to be disabled. This may involve sending a notification instructing a service station employee to disable the system, or possibly to an automated system at the service station that will automatically disable the system. It can also involve sending a notification to a service technician to enable the service technician to remove the card skimmer from the target system. It can additionally involve sending a notification that causes a photograph or other information to be obtained that can possibly be used to identify a perpetrator who installed the card skimmer in the target system. This may involve sending a notification instructing a service station employe to obtain footage from video cameras at the service station, or possibly to an automated system at the service station that will automatically obtain the footage.

Figure 3:
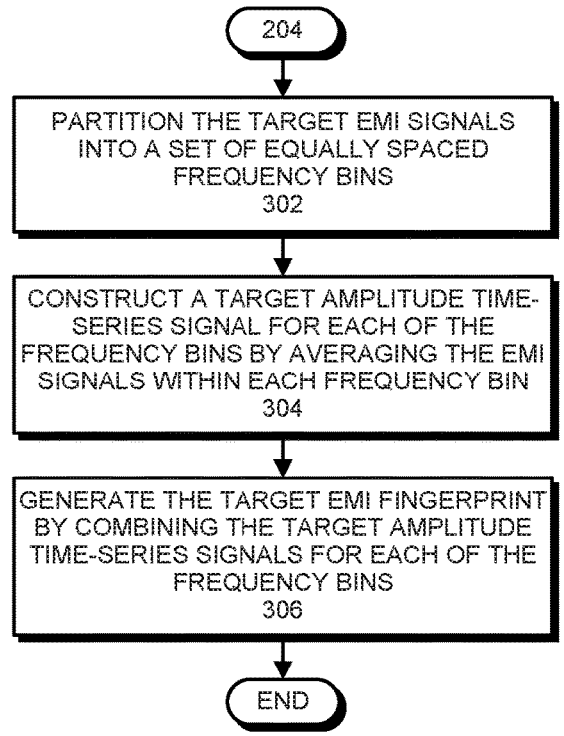
FIG. 3 presents a flow chart illustrating operations performed by the system while generating a target EMI fingerprint from target EMI signals.

FIG. 3 presents a flow chart illustrating operations performed by the system while generating the target EMI fingerprint from the target EMI signals. (This flow chart illustrates in more detail the operations performed in step 204 of the flow chart in FIG. 2.) During this process, the system partitions the target EMI signals into a set of equally spaced frequency bins (step 302). Next, the system constructs a target amplitude time-series signal for each of the frequency bins by averaging the EMI signals within each frequency bin (step 304). Finally, the system generates the target EMI fingerprint by combining the target amplitude time-series signals for each of the frequency bins (step 306).

Figure 4:
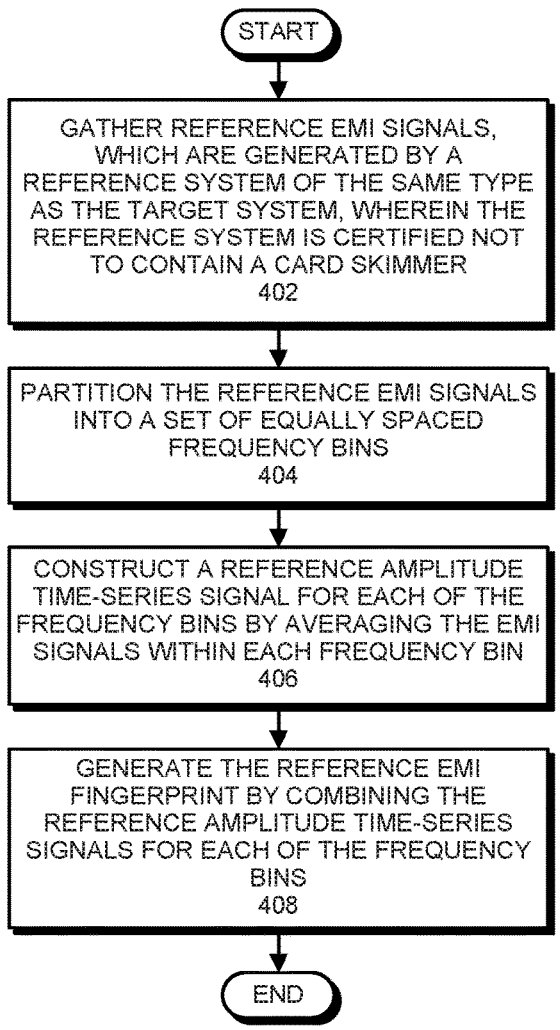
FIG. 4 presents a flow chart illustrating operations performed by the system while generating the reference EMI fingerprint in accordance with the disclosed embodiments.

FIG. 4 presents a flow chart illustrating operations performed by the system while generating the reference EMI fingerprint in accordance with the disclosed embodiments. First, the system gathers reference EMI signals, which are generated by a reference system of the same type as the target system, wherein the reference system is certified not to contain a card skimmer (step 402). Next, the system generates the reference EMI fingerprint from the reference EMI signals. During, this process, the system first partitions the reference EMI signals into a set of equally spaced frequency bins (step 404). Next, the system constructs a reference amplitude time-series signal for each of the frequency bins by averaging the EMI signals within each frequency bin (step 406). Finally, the system generates the reference EMI fingerprint by combining the reference amplitude time-series signals for each of the frequency bins (step 408).

Figure 5:
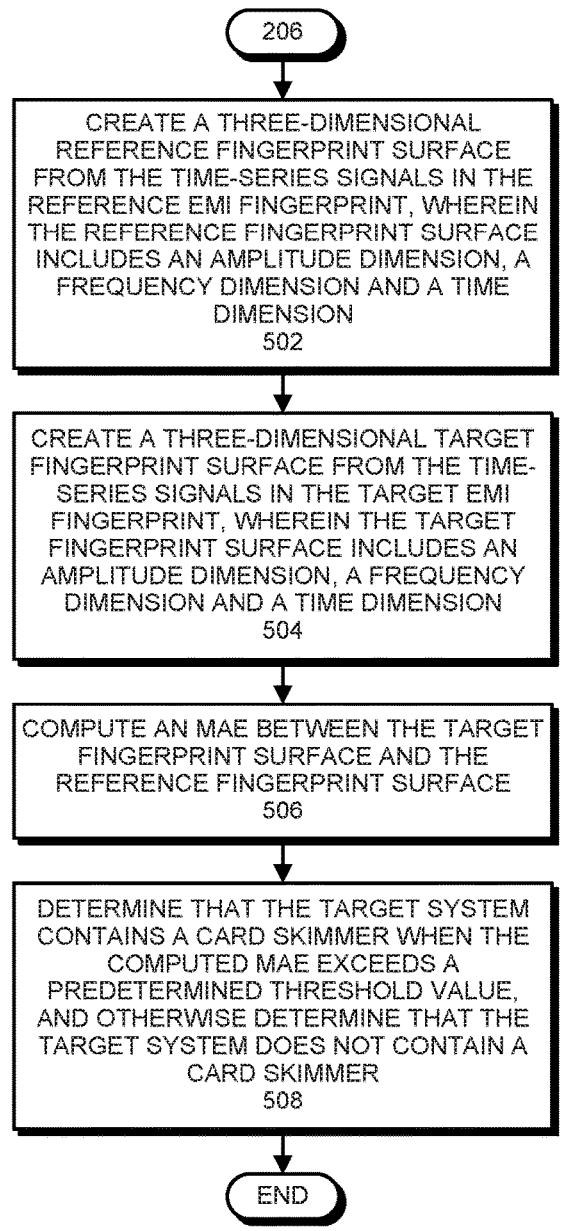
FIG. 5 presents a flow chart illustrating operations performed by the system while comparing the target EMI fingerprint against a reference EMI fingerprint in accordance with the disclosed embodiments.

FIG. 5 presents a flow chart illustrating operations performed by the system while comparing the target EMI fingerprint against the reference EMI fingerprint in accordance with the disclosed embodiments. (This flow chart illustrates in more detail the operations performed in step 206 of the flow chart in FIG. 2.) During this process, the system creates a three-dimensional reference fingerprint surface from the time-series signals in the reference EMI fingerprint, wherein the reference fingerprint surface includes an amplitude dimension, a frequency dimension and a time dimension (step 502). The system also creates a three-dimensional target fingerprint surface from the time-series signals in the target EMI fingerprint, wherein the target fingerprint surface includes an amplitude dimension, a frequency dimension and a time dimension (step 504). Next, the system computes an MAE between the target fingerprint surface and the reference fingerprint surface (step 506). Finally, the system determines that the target system contains a card skimmer when the computed MAE exceeds a predetermined threshold value, and otherwise determines that the target system does not contain a card skimmer (step 508). In one embodiment, the predetermined threshold value is defined to be 10% over a "golden MAE value" for a reference system, which is certified not to contain a card skimmer. If the MAE value for the target system exceeds the golden MAE value by more than 10%, we suspect that the target system includes a card skimmer.

Figure 6:
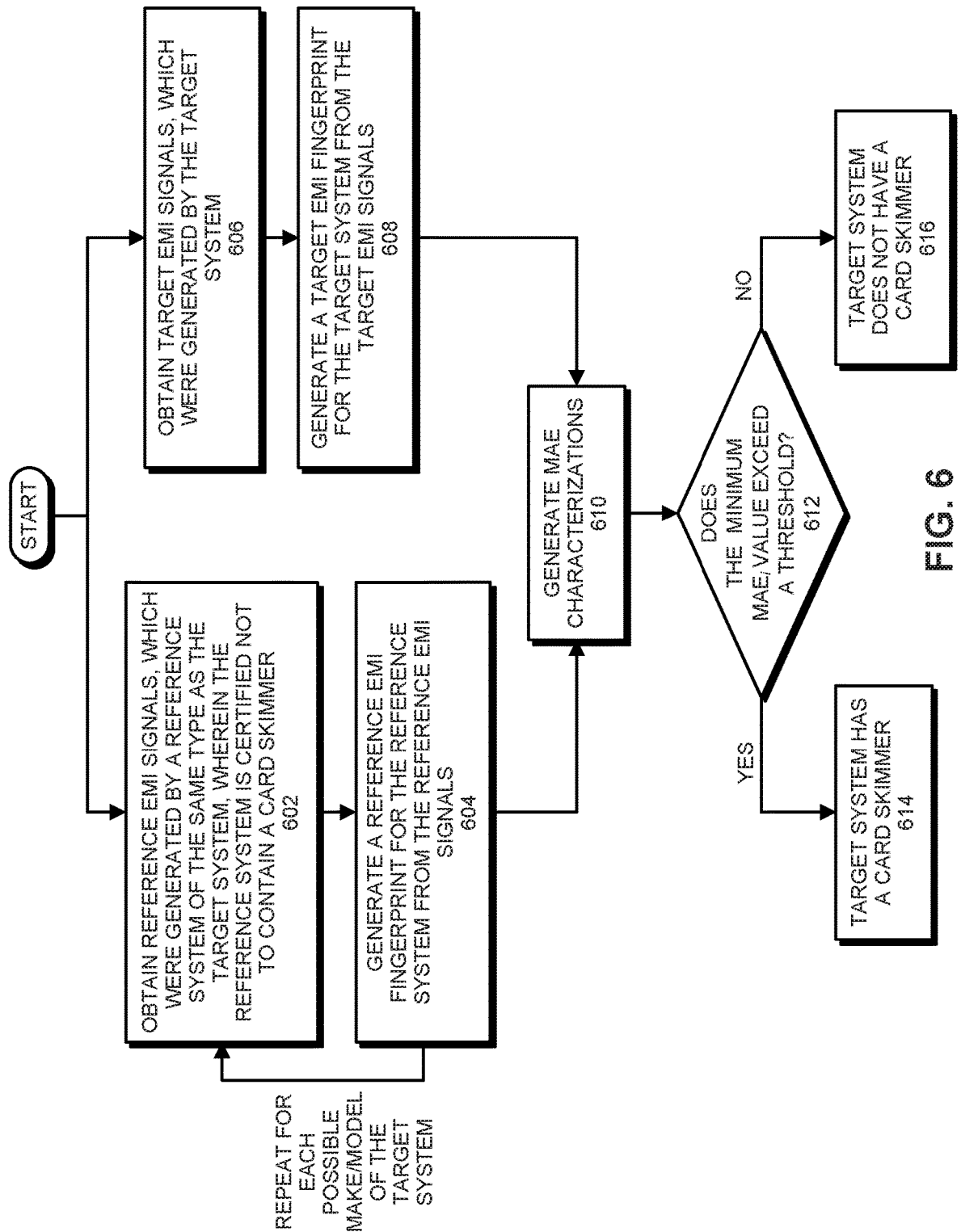
FIG. 6 presents a more-detailed flow chart illustrating a process for detecting a card skimmer in a target system in accordance with the disclosed embodiments.

FIG. 6 presents a more-detailed flow chart illustrating a process for detecting a card skimmer in a target system in accordance with the disclosed embodiments. At the start of the process, the system obtains reference EMI fingerprints for all possible makes/models of the target system. This involves repeating steps 602 and 604 for each possible make/model of the target system to produce a library of reference EMI fingerprints. During this process, the system obtains reference EMI signals, which were generated by a reference system of the same type as the target system, wherein the reference system is certified not to contain a card skimmer (step 602). Next, the system generates a reference EMI fingerprint for the reference system from the reference EMI signals (step 604). (As mentioned above, this involves: partitioning the reference EMI signals into a set of equally spaced frequency bins; constructing a reference amplitude time-series signal for each of the frequency bins by averaging the EMI signals within each frequency bin; and then combining the reference amplitude time-series signals for each of the frequency bins to produce the reference EMI fingerprint.)

The system also obtains target EMI signals, which were generated by the target system (step 606), and generates a target EMI fingerprint from the target EMI signals (step 608). Next, the system generates MAE characterizations (step 610) based on the target EMI fingerprint and the library of EMI fingerprints through the process described in the flow chart in FIG. 7. The system then determines whether the minimum $MAE_i$ value calculated in step 610 exceeds a threshold (step 612). If so (YES at step 612), the target system has a card skimmer (step 614). Otherwise (NO at step 612), the target system does not have a card skimmer (step 616).

Figure 7:
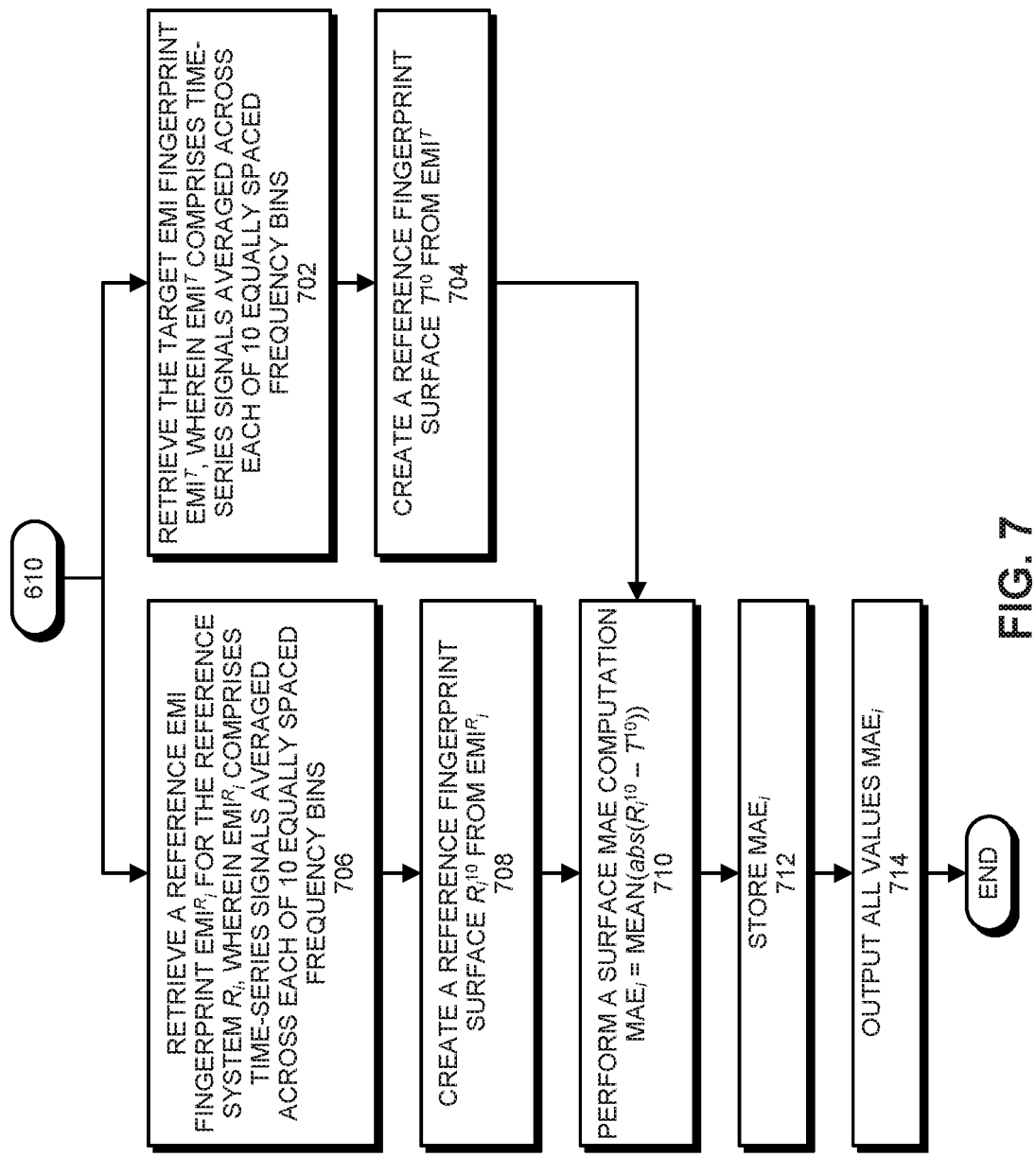
FIG. 7 presents a more-detailed flow chart illustrating a process for performing a mean absolute error (MAE) characterization in accordance with the disclosed embodiments.

FIG. 7 presents a more-detailed flow chart illustrating a process for performing a mean absolute error (MAE) characterization in accordance with the disclosed embodiments. (This flow chart illustrates in more detail the operations performed in step 610 of the flow chart in FIG. 6.) At the start of this process, the system retrieves the target EMI fingerprint $EMI^T$, wherein $EMI^T$ comprises time-series signals averaged across each of ten equally spaced frequency bins (step 702). Next, the system creates a reference fingerprint surface $T^{10}$ from $EMI^T$ (step 704).

The system then repeats the following four steps for each reference fingerprint $EMI^R_i$. First, the system retrieves a reference EMI fingerprint $EMI^R_i$ for the reference system $R_i$, wherein $EMI^R_i$ comprises time-series signals averaged across each of ten equally spaced frequency bins (step 706). Next, the system creates a reference fingerprint surface $R_i^{10}$ from $EMI^R_i$ (step 708). The system then performs a surface MAE computation $MAE_i = mean(abs(R_i^{10} - T^{10}))$ (step 710) and stores the resulting $MAE_i$ (step 712). Finally, the system outputs all values $MAE_i$ (step 714).

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A method for detecting a card skimmer in a target system, wherein the card skimmer surreptitiously gathers credit/debit card information during operation of the target system, the method comprising:
    gathering target electromagnetic interference (EMI) signals by monitoring EMI signals generated by the target system through an external scanner with a directional antenna;
    generating a target EMI fingerprint from the target EMI signals; and
    comparing the target EMI fingerprint against a reference EMI fingerprint for the target system to determine whether the target system contains a card skimmer;
    wherein the external scanner comprises a portable scanner with a microcontroller.

2. The method of claim 1, wherein the target system comprises one of the following:
    a gas pump with a credit/debit card reader;
    a point of sale (POS) system with a credit/debit card reader; and
    an automated teller machine (ATM) with a credit/debit card reader.

3. The method of claim 1, wherein the method further comprises performing one or more of the following remedial actions when the target system is determined to include a card skimmer:
    sending a notification that causes the target system to be disabled;
    sending a notification to a service technician to enable the service technician to remove the card skimmer from the target system; and
    sending a notification that causes a photograph or other information to be obtained that can possibly be used to identify a perpetrator who installed the card skimmer in the target system.

4. The method of claim 1, wherein generating the target EMI fingerprint from the target EMI signals comprises:
    partitioning the target EMI signals into a set of equally spaced frequency bins;
    constructing a target amplitude time-series signal for each of the frequency bins by averaging the EMI signals within each frequency bin; and
    generating the target EMI fingerprint by combining the target amplitude time-series signals for each of the frequency bins.

5. The method of claim 1, wherein prior to obtaining the target EMI signals, the method further comprises generating the reference EMI fingerprint by:
    gathering reference EMI signals, which were generated by a reference system of the same type as the target system, wherein the reference system is certified not to contain a card skimmer; and
    generating the reference EMI fingerprint from the reference EMI signals.

6. The method of claim 5, wherein generating the reference EMI fingerprint from the reference EMI signals involves:
    partitioning the reference EMI signals into a set of equally spaced frequency bins;
    constructing a reference amplitude time-series signal for each of the frequency bins by averaging the EMI signals within each frequency bin; and
    generating the reference EMI fingerprint by combining the reference amplitude time-series signals for each of the frequency bins.

7. The method of claim 6, wherein comparing the target EMI fingerprint against the reference EMI fingerprint involves:
    creating a three-dimensional reference fingerprint surface from the time-series signals in the reference EMI fingerprint, wherein the reference fingerprint surface includes an amplitude dimension, a frequency dimension and a time dimension;
    creating a three-dimensional target fingerprint surface from the time-series signals in the target EMI fingerprint, wherein the target fingerprint surface includes an amplitude dimension, a frequency dimension and a time dimension;
    computing a mean absolute error (MAE) between the target fingerprint surface and the reference fingerprint surface; and
    determining that the target system contains a card skimmer when the computed MAE exceeds a predetermined threshold value, and otherwise determining that the target system does not contain a card skimmer.

8. The method of claim 1, wherein comparing the target EMI fingerprint against the reference EMI fingerprint comprises comparing the target EMI fingerprint against multiple reference EMI fingerprints for all possible makes/models of the target system, so that the detection operation can be used for all possible makes/models of the target system.

9. A non-transitory, computer-readable storage medium storing instructions that when executed by a computer cause the computer to perform a method for detecting a card skimmer in a target system, wherein the card skimmer surreptitiously gathers credit/debit card information during operation of the target system, the method comprising:
  gathering target electromagnetic interference (EMI) signals by monitoring EMI signals generated by the target system through an external scanner with a directional antenna;
  generating a target EMI fingerprint from the target EMI signals; and
  comparing the target EMI fingerprint against a reference EMI fingerprint for the target system to determine whether the target system contains a card skimmer;
  wherein the external scanner comprises a portable scanner with a microcontroller.

10. The non-transitory, computer-readable storage medium of claim 9, wherein the target system comprises one of the following:
  a gas pump with a credit/debit card reader;
  a point of sale (POS) system with a credit/debit card reader; and
  an automated teller machine (ATM) with a credit/debit card reader.

11. The non-transitory, computer-readable storage medium of claim 9, wherein the method further comprises performing one or more of the following remedial actions when the target system is determined to include a card skimmer:
  sending a notification that causes the target system to be disabled;
  sending a notification to a service technician to enable the service technician to remove the card skimmer from the target system; and
  sending a notification that causes a photograph or other information to be obtained that can possibly be used to identify a perpetrator who installed the card skimmer in the target system.

12. The non-transitory, computer-readable storage medium of claim 9, wherein generating the target EMI fingerprint from the target EMI signals comprises:
  partitioning the target EMI signals into a set of equally spaced frequency bins;
  constructing a target amplitude time-series signal for each of the frequency bins by averaging the EMI signals within each frequency bin; and
  generating the target EMI fingerprint by combining the target amplitude time-series signals for each of the frequency bins.

13. The non-transitory, computer-readable storage medium of claim 9, wherein prior to obtaining the target EMI signals, the method further comprises generating the reference EMI fingerprint by:
  gathering reference EMI signals, which were generated by a reference system of the same type as the target system, wherein the reference system is certified not to contain a card skimmer; and
  generating the reference EMI fingerprint from the reference EMI signals.

14. The non-transitory, computer-readable storage medium of claim 13, wherein generating the reference EMI fingerprint from the reference EMI signals involves:
  partitioning the reference EMI signals into a set of equally spaced frequency bins;
  constructing a reference amplitude time-series signal for each of the frequency bins by averaging the EMI signals within each frequency bin; and
  generating the reference EMI fingerprint by combining the reference amplitude time-series signals for each of the frequency bins.

15. The non-transitory, computer-readable storage medium of claim 14, wherein comparing the target EMI fingerprint against the reference EMI fingerprint involves:
  creating a three-dimensional reference fingerprint surface from the time-series signals in the reference EMI fingerprint, wherein the reference fingerprint surface includes an amplitude dimension, a frequency dimension and a time dimension;
  creating a three-dimensional target fingerprint surface from the time-series signals in the target EMI fingerprint, wherein the target fingerprint surface includes an amplitude dimension, a frequency dimension and a time dimension;
  computing a mean absolute error (MAE) between the target fingerprint surface and the reference fingerprint surface; and
  determining that the target system contains a card skimmer when the computed MAE exceeds a predetermined threshold value, and otherwise determining that the target system does not contain a card skimmer.

16. The non-transitory, computer-readable storage medium of claim 9, wherein comparing the target EMI fingerprint against the reference EMI fingerprint comprises comparing the target EMI fingerprint against multiple reference EMI fingerprints for all possible makes/models of the target system, so that the detection operation can be used for all possible makes/models of the target system.

17. A system that detects a card skimmer in a target system, wherein the card skimmer surreptitiously gathers credit/debit card information during operation of the target system, wherein the system comprises:
  at least one processor and at least one associated memory; and
  program code that executes on the at least one processor, wherein the program code:
    gathers target electromagnetic interference (EMI) signals by monitoring EMI signals generated by the target system through an external scanner with a directional antenna;
    generates a target EMI fingerprint from the target EMI signals; and
    compares the target EMI fingerprint against a reference EMI fingerprint for the target system to determine whether the target system contains a card skimmer;
    wherein the external scanner comprises a portable scanner with a microcontroller.

18. The system of claim 17, wherein the program code further executes on the at least one processor to perform one or more of the following remedial actions when the target system is determined to include a card skimmer:
  sending a notification that causes the target system to be disabled;
  sending a notification to a service technician to enable the service technician to remove the card skimmer from the target system; and
  sending a notification that causes a photograph or other information to be obtained that can possibly be used to identify a perpetrator who installed the card skimmer in the target system.

* * * * *